United States Patent

[11] 3,631,310

[72] Inventor Mukunda Behari Das
Thornton Heath, England
[21] Appl. No. 688,227
[22] Filed Dec. 5, 1967
[45] Patented Dec. 28, 1971
[73] Assignee U.S. Philips Corporation
New York, N.Y.
[32] Priority Dec. 13, 1966
[33] Great Britain
[31] 55,813/66

[54] INSULATED GATE FIELD EFFECT TRANSISTORS
9 Claims, 8 Drawing Figs.

[52] U.S. Cl. .......... 317/235 R, 317/235 B, 317/235 AM
[51] Int. Cl. .......... H01l 7/14, H01l 11/00
[50] Field of Search .......... 317/235 (21.1), 235 (222); 307/304; 330/38 FC

[56] References Cited
UNITED STATES PATENTS

| | | | |
|---|---|---|---|
| 3,305,708 | 2/1967 | Ditrick | 317/235 |
| 3,340,598 | 9/1967 | Hatcher | 317/235 |
| 3,419,766 | 12/1968 | Ono | 317/235 |
| 3,456,168 | 7/1969 | Tatom | 317/235 |

*Primary Examiner*—Jerry D. Craig
*Attorney*—Frank R. Trifari

ABSTRACT: An insulated gate field effect transistor having in the channel region extending from the source to the drain, at least to the depth of the source, a laterally decreasing concentration of substrate-type impurities, with the result that the resistivity of the channel region decreases as the source is approached. An advantage is that the source and drain may be closely spaced while avoiding punchthrough at the usual drain source voltage.

Figure 1:
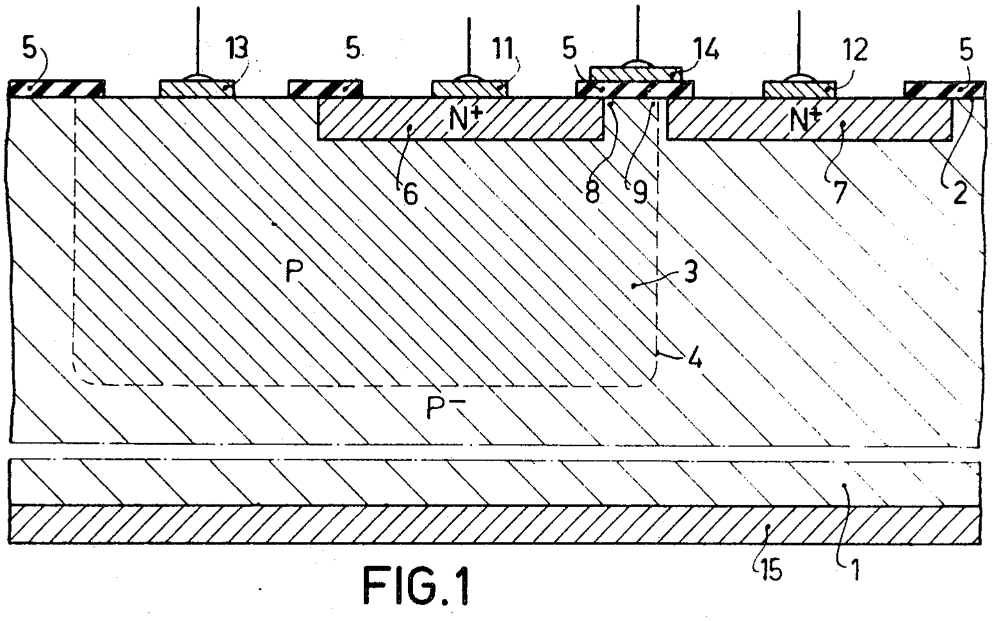

INVENTOR.
MOKUNDA B. DAS

BY

AGENT

INVENTOR.
MOKUNDA B. DAS
BY
[signature]
AGENT

INVENTOR.
MOKUNDA B. DAS
BY
Frank R. Trifari
AGENT

INSULATED GATE FIELD EFFECT TRANSISTORS

This invention relates to insulated gate field effect transistors. In transistors of this type current flow in a monocrystalline semiconductor substrate of one conductivity type between spaced source and drain regions of the opposite conductivity type at a surface region of the substrate is modulated by a voltage applied to a gate electrode extending above the surface region between the source and drain regions and insulated from the surface region by an insulating layer.

The lateral spacing between the source and drain regions is a factor which affects the electrical properties of the device and the mutual conductance ($g_m$) is increased by reducing the lateral spacing of these regions. However the substrate of the transistor generally has a relatively high resistivity, a common value of substrate impurity concentration being $10^{14}$ atoms/cc. Reducing the lateral spacing between the source and drain regions by too great an extent will cause the depletion layer of the reverse-biased PN-junction between the drain and substrate to extend to the PN-junction between the source and substrate and thus give punchthrough in the substrate at low applied voltages between the source and drain electrodes.

Increasing the concentration of active impurity in the substrate would appear to be a feasible way of increasing the punchthrough voltage but such an increase affects the properties of the device in a deleterious manner. Thus with a more highly doped substrate a higher gate voltage is needed in order to induce the same amount of charge under the gate compared to a device with the same geometry but with a substrate having a lower impurity concentration. This effect becomes particularly significant when the device is operated above the saturation "knee." Thus the $g_m$ of the device with reference to gate terminal will be reduced but that with reference to substrate terminal will be increased, that is to say, the mutual conductances become dependent on the properties of the substrate.

According to the invention, an insulated gate field effect transistor comprises a monocrystalline semiconductor substrate of one conductivity type having a plane surface, two spaced surface regions of the opposite conductivity type extending from the plane surface into the substrate and constituting source and drain regions, a dielectric layer situated on the plane surface of the substrate between the source and drain regions and a conductive layer situated on the dielectric layer constituting the gate electrode, the region of the substrate situated between the source and drain regions and immediately adjacent the plane surface having a nonuniform lateral concentration of impurity characteristic of the one conductivity type which in at least a portion of said region of the substrate adjacent the source region is greater than the concentration of impurity characteristic of the one conductivity type in the underlying region of the substrate and increases in the lateral direction from the drain towards the source region, ohmic contacts to the source, drain and gate and an ohmic contact to the substrate.

In such a transistor the provision of the nonuniform lateral concentration of impurity characteristic of the one (substrate) conductivity type in the said region permits a low lateral spacing of the source and drain regions while maintaining a high value of the mutual conductance of the transistor and without giving rise to a punchthrough in the substrate at low applied voltages between the source and drain regions. The said nonuniform lateral concentration of impurity also permits the obtainment of insulated gate field effect transistors suitable for operation in the enhancement mode which transistors are ideal for incorporation in integrated direct coupled MOST circuits.

In a preferred form of an insulated gate field effect transistor according to the invention the said portion of the substrate region adjacent the source region lies within the laterally diffused part of a diffused substrate region of the one conductivity type formed by diffusion of an impurity element characteristic of the one (substrate) conductivity type into a limited area of the plane surface of the substrate. It will be appreciated that nonuniform lateral concentration of impurity characteristic of the one conductivity type in the said region can be obtained by methods other than diffusion techniques, for example, by ion implantation techniques.

In one form of a transistor in which the said portion of the substrate region lies within the laterally diffused part of a diffused substrate region, this configuration permits a relatively low series resistance substrate connection to be made, an ohmic contact to the diffused substrate region being provided on the plane surface, the diffused substrate region providing efficient shielding between the source and drain. Furthermore the drain to substrate capacitance is low. The said configuration is also advantageous when it is desired to manufacture an insulated gate field effect transistor suitable for operation in a circuit in which the source and substrate are shorted. This is readily achieved by modifying the contact configuration such that the source region is electrically connected to the diffused substrate region at the plane surface.

The said nonuniform lateral impurity concentration permits the obtainment of a transistor in which the lateral spacing of the source and drain regions may be at most 5 $\mu$. The variation of impurity concentration may exist throughout the whole length of the substrate region between the source and drain regions but this is not essential. Preferably there is a large variation of impurity concentration at least within a distance of 0.5 $\mu$ from the source region in the lateral direction.

Figure 2:
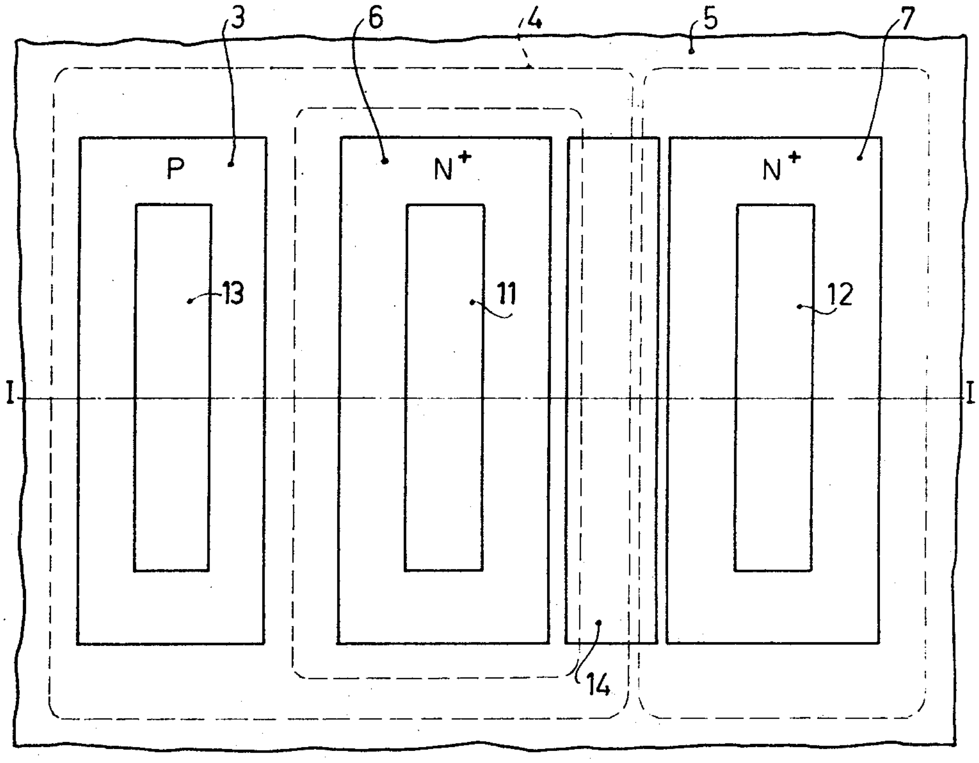
Figure 3:
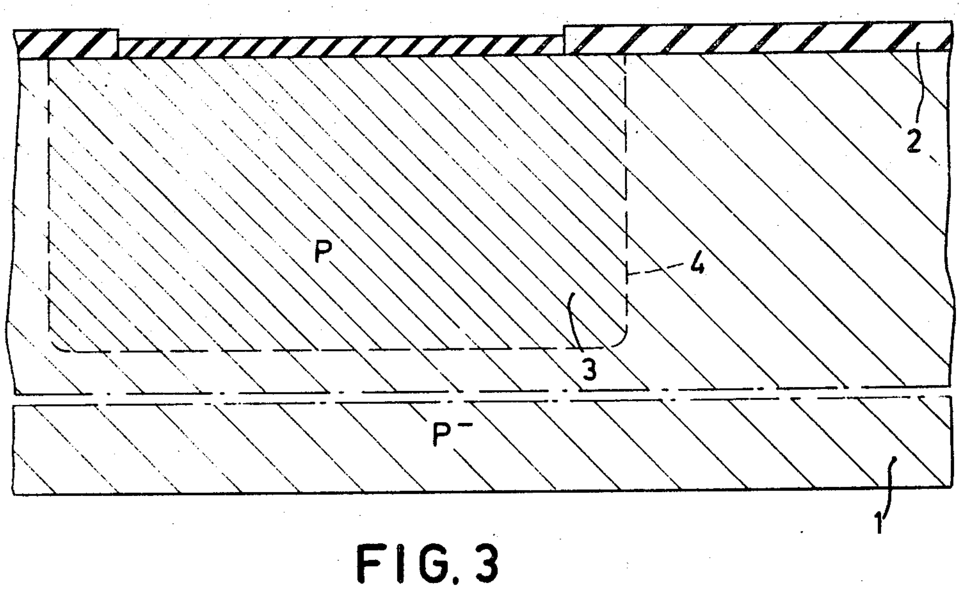
Figures 1A, 4:
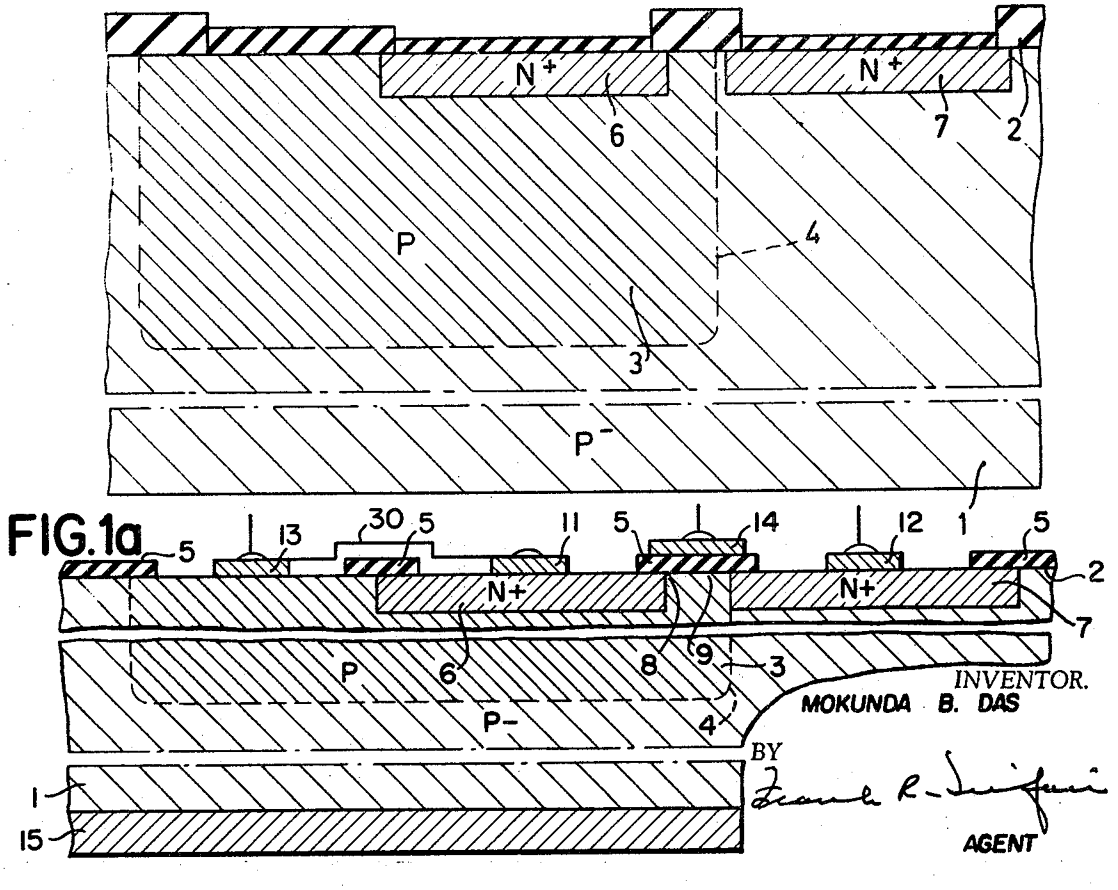
Figure 5:
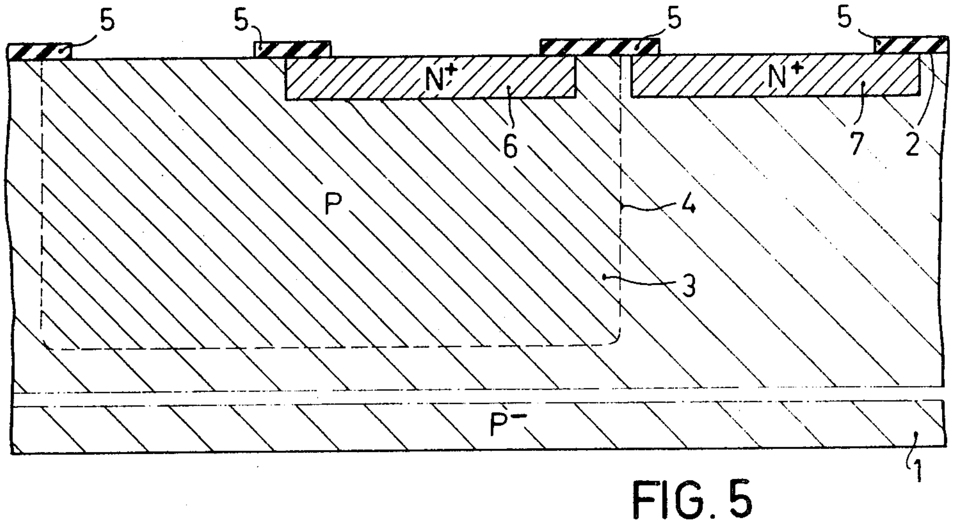
Figure 6:
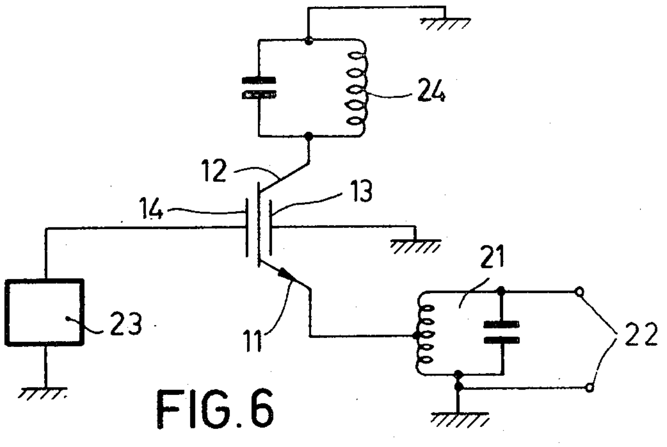
Figure 7:
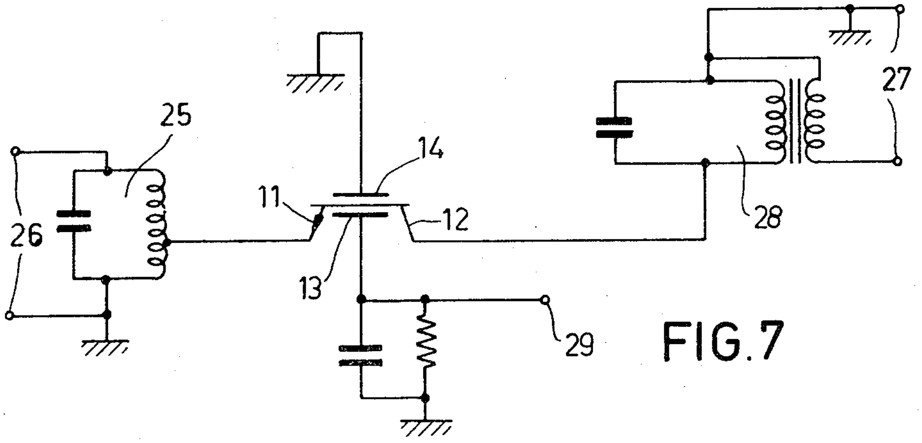

An embodiment of an insulated gate field effect transistor will now be described with reference to the accompanying diagrammatic drawings in which:

FIGS. 1 and 1*a* show a cross-sectional view of the semiconductor body of the transistor and of a modification, respectively; and FIG. 2 shows a plan view of the transistor, the section of FIG. 1 being along the line I—I of FIG. 2;

FIGS. 3, 4 and 5 illustrate various stages of the manufacture of the transistor shown in FIGS. 1 and 2; and FIGS. 6 and 7 show circuits which include the transistor shown in FIGS. 1 and 2.

The insulated gate field effect transistor comprises a P-type monocrystalline silicon substrate 1 of 200 $\mu$ thickness having a plane surface 2. The substrate 1 has an acceptor concentration of boron of $10^{14}$ atoms/cc. A diffused substrate region 3 extends from the plane surface 2 into the substrate 1, the extent of the diffusion front being shown by a dotted line 4 lying at a depth from the surface 2 of 5.5 $\mu$ and having a width in the section shown of 40 $\mu$. On the surface 2 there is an insulating layer 5 of silicon oxide of 0.2 $\mu$ thickness. An N-type diffused source region 6 extends from the surface 2 into the diffused substrate region 3 and an N-type diffused drain region 7 extends from the surface 2 into the substrate 1. The source and drain region have the same diffused donor concentrations of phosphorous, the surface concentration being $5\times10^{21}$ atoms/cc. and the parts of the PN-junctions between these regions and the region 3 and the substrate 1 respectively which are parallel to the surface 2 each lying at a depth from the surface 2 of 1.5 $\mu$. The source and drain regions each have a width in the section shown of 20 $\mu$ and the separation between these regions at the surface 2 is approximately 4 $\mu$. The diffusion front 4 extends to the surface 2 in the immediate vicinity of the PN-junction between the drain region 7 and the substrate 1. At the position 8 just below the surface 2 and close to the PN-junction between the source region 6 and the diffused region 3 the diffused boron concentration in the region 3 is approximately $8\times10^{16}$ atoms/cc. whereas at the position 9 just below the surface the diffused boron concentration is approximately $5\times10^{14}$ atoms/cc. Thus a nonuniform lateral acceptor concentration is present in the region of the substrate between the source region 6 and the drain region 7 which increases in the lateral direction from the drain region 7 towards the source region 6. In apertures in the insulating layer 5 there are ohmic contacts 11 and 12 to the source region 6 and drain region 7 respectively and an ohmic contact 13 to the diffused substrate region 3. The ohmic contacts 11, 12, 13 each consist of a layer of aluminum of 0.2 μ thickness which has been vapor deposited on the surface 2 in the respective aperture in the insulating layer 5 with the aid of an apertured mask. On the part of the insulating layer 5 situated on the surface 2 between the source and drain regions 6 and 7 there is a further aluminum layer 14 of 0.2 μ thickness which constitutes the gate electrode. The width of the layer 14 in the section shown in 6 μ. The silicon body is mounted on a support 15 which forms an ohmic contact to the substrate 1. Connecting wires are secured to the ohmic contacts 11 12 and 13 and to the gate electrode 14.

In operation of the transistor, the source region 6 is biased negatively with respect to the drain region 7. This polarity of applied voltage reverse biases the PN-junction between the drain region 7 and the substrate (1, 3) and current does not flow between the regions 6 and 7. When a positive voltage is applied to the gate electrode 14 the concentration of electrons in the region 3 between the source region 6 and drain region 7 just below the silicon oxide layer on the surface 2 is increased and at a certain applied voltage an N-type inversion layer current-carrying channel is formed between the source region 6 and drain region 7. It will be appreciated that the surface region at position 9 will invert at a lower gate voltage than at position 8 due to the nonuniform lateral acceptor concentration in the substrate region 3 between the source region 6 and drain region 7.

When an N-type channel exists between the source region 6 and drain region 7 the current flow of majority carriers (electrons) in this channel can be modulated by the gate voltage applied. Under saturation conditions of operation the pinchoff will occur at position 9 and this will ensure negligible dependence of saturation characteristics on substrate impurity concentration.

The ohmic contact 13 to the region 3 provides a low-resistance path to the portion of the P-type diffused substrate region adjacent the N-type channel. With the dimensions and impurity concentrations quoted the series resistance of this low-resistance path is approximately 60 Ω while the series resistance from the contact 15 through the substrate 1 is about 1 kΩ due to the higher resistivity of the region 1 compared to the bulk resistivity of the region 3. Thus the configuration described, in which the source region 6 lies wholly within the diffused substrate region 3, allows a low-resistivity substrate connection to be made which improves the frequency characteristics. Also the low-resistance path from the substrate contact 13 allows the device to be used in a mixer circuit at a higher efficiency than a conventional device.

In the device punchthrough from the depletion layer associated with the reverse-biased PN-junction between the drain region 7 and the substrate (1, 3) to the source region 6 will occur at a higher source/drain voltage compared with a device of the same dimensions but in which the diffused substrate region is not present, due to the higher concentration of active impurity at the position 8.

The transistor described has a relatively small spacing between the source and drain regions viz, 4μ without punch through occuring at a reduced source/drain voltage. As described earlier in the specification an increase in the concentration of active impurity in the substrate will affect the characteristics of the transistor, however in the transistor described the impurity concentration increases laterally along the complete current-carrying channel and is relatively high only in the immediate vicinity of the source region 6 and thus the device characteristics, such as the mutual conductance, are influenced to only a small degree.

The contact structure may be suitable modified for a transistor suitable for use in certain circuits where the source and substrate are connected in common by forming a common contact 30 at the surface 2 to the diffused surface region 3 and the source region 6, as illustrated in FIG. 1*a*. FIG. 1*a* also shows the diffused substrate region 3 extending to the drain 7.

The insulated gate field effect transistor shown in FIGS. 1 and 2 is manufactured by the conventional techniques of oxide machining, photoprocessing, etching, diffusion, etc. used in semiconductor device manufacture. Some of the basic steps will now be described with reference to FIGS. 3 to 5.

The starting material is a monocrystalline P-type silicon substrate 1 uniformly doped with boron ($10^{14}$ atoms/cc.) and of 200 μ thickness. It will be appreciated by those familiar with semiconductor device manufacture that a plurality of transistor assemblies will be fabricated on a single slice of silicon but for the sake of convenience the steps in the processing of a single transistor on the slice will be described. A silicon oxide layer is grown on the plane surface 2 of the substrate 1. A rectangular aperture is then formed in the oxide layer by a photoprocessing and etching step, the aperture having a width of 30 μ in the section shown in FIG. 3. A boron diffusion process is carried out into the exposed surface portion so that the diffusion front extends to a depth of approximately 5.5 μ from the surface and the lateral diffusion under the silicon oxide is approximately 4.5 μ on all sides. The boron surface concentration at the exposed surface portion is approximately $10^{20}$ atoms/cc. During the boron diffusion process the initially formed silicon oxide layer becomes thicker and a further insulating layer part is formed on the exposed surface portion. FIG. 3 shows the silicon body after the boron diffusion, the extent of the diffusion front being shown by the dotted line 4.

Two further rectangular apertures, of smaller area than the first-formed aperture, are then made in the insulating layer by a photoprocessing and etching step such that the adjacent boundaries of the newly formed apertures are spaced by about 6μ, one such boundary lying substantially at the position of the corresponding boundary part of the first-formed aperture and the other such boundary being spaced about 1.5 μ from the previously formed boron diffusion front at the surface 2. Phosphorus is then diffused into the two exposed surface portions to form the $N^+$source and drain regions 6 and 7 having a surface concentration of $5\times10^{21}$ atoms/cc. The PN-junction between the source region 6 and the diffused substrate region 3 and the PN-junction between the drain region 7 and the substrate 1 each lie at a distance of 1.5 μ from the surface 2 where they extend parallel to the surface. The PN-junction between the drain region 7 and the substrate 1 extends to the surface 2 on one side in close proximity to the diffusion front 4. During the phosphorus diffusion further insulating layer parts are formed on the exposed surface portions. FIG. 4 shows the silicon body after the phosphorus diffusion step.

The insulating layer is now removed completely from the surface 2 and a fresh insulating layer 5 of silicon oxide of 0.2 μ thickness is formed on the surface. Apertures are formed in the newly formed oxide layer by a photoprocessing and etching step to expose the source region 6, the drain region 7 and the diffused substrate region 3. FIG. 5 shows the silicon body after forming these apertures in the oxide layer. With the aid of an apertured mask aluminum is evaporated on the surface to form layers on part of the exposed surface portions in the apertures and thus form ohmic contacts 11, 12 and 13 to the source, drain and diffused substrate regions respectively. The widths of the aluminum layers in the section shown in FIG. 1 are each 5 μ. A layer of aluminum is also deposited on the oxide layer between the source and drain regions to form the gate electrode 14, the width of the layer in the section of FIG. 1 being 6 μ. The thickness of the aluminum layer is 0.2 μ. The substrate 1 is thereafter mounted upon a metal plate by a suitable soldering process and lead wires attached to the ohmic contacts and the gate electrode by thermocompression bonding. It will be appreciated that the contacts 11, 12 and 13 and the gate electrode 14 can alternatively be formed by depositing aluminum over the whole surface after forming apertures in the oxide layer. Thereafter the aluminum is selectively removed by a photoprocessing and etching step.

FIG. 6 shows a mixer circuit employing an insulated gate field effect transistor as described with reference to FIGS. 1 and 2. The source electrode 11 is connected to a tuned circuit 21 across which is applied an input signal through terminals 22. A local oscillator circuit 23 is connected to the gate electrode 14 and the contact 13 on the diffused substrate region is connected to earth. The drain electrode 12 is connected to a tuned circuit 24. In operation the insulated gate field effect transistor acts as a mixer and the tuned circuit 24 may be tuned to a frequency which is the difference between the mixer frequency and the local oscillator frequency.

FIG. 7 shows an AGC circuit employing an insulated gate field effect transistor as described with reference to FIGS. 1 and 2 and illustrates an application of the transistor in which a voltage is applied to the contact to the diffused substrate region 3. The gate electrode 14 is connected to an earth point and the source electrode 11 is connected to a tuned circuit 25 through which a signal may be applied to the device through the terminals 26. The drain electrode 12 is connected to output terminals 27 through a tuned circuit 28. The ohmic contact 13 to the diffused substrate region 3 is connected to a terminal 29 to which is applied an AGC voltage.

What is claimed is:

1. An insulated gate field effect transistor comprising a monocrystalline semiconductor substrate portion of one type conductivity having a plane surface, first and second spaced surface diffused regions of the opposite type conductivity located within the substrate portion and constituting source and drain regions, respectively, a third surface diffused region of the said one type conductivity in the substrate, said third region containing active impurities forming said one type conductivity distributed in a concentration which decreases from the plane surface into the substrate bulk and which also decreases laterally in a peripheral portion, a dielectric layer on the substrate plane surface between the source and drain regions which constitutes a channel region, a conductive layer on the dielectric layer and overlying the channel region and constituting a gate electrode, said first source region lying wholly within the third region and spaced from its lateral boundary and with the side of the source contiguous with the channel region being located within the peripheral portion of the third region of laterally decreasing impurity concentration which thereby becomes located in the channel region, said channel region thereby having adjacent the source a one type forming impurity concentration that is larger than that in the substrate portion underlying the third region and that decreases in the direction from source to drain, and ohmic contacts to the source, drain, gate and substrate portion.

2. A transistor as set forth in claim 1 wherein the peripheral portion containing the laterally decreasing impurity concentration extends to the drain region.

3. A transistor as set forth in claim 1 wherein the ohmic contact to the substrate region is made to a surface portion of the third region available to said plane surface.

4. A transistor as set forth in claim 3 wherein the ohmic contact on the third region is located on the side of the source remote from the drain.

5. A transistor as set forth in claim 3 and further including means interconnecting the ohmic contacts on the third region and on the source.

6. A transistor as set forth in claim 1 wherein the source-drain spacing is at most 5$\mu$.

7. An insulated gate field effect transistor comprising a monocrystalline semiconductor substrate portion of one type conductivity having a plane surface, first and second spaced surface diffused regions of the opposite type conductivity located within the substrate portion and constituting source and drain regions, respectively, a third surface diffused region of the said one type conductivity in the substrate, said third region containing active impurities forming said one type conductivity distributed in a concentration which decreases from the plane surface into the substrate bulk and which also decreases laterally in a peripheral portion, a dielectric layer on the substrate plane surface between the source and drain regions which constitutes a channel region, a conductive layer on the dielectric layer and overlying the channel region and constituting a gate electrode, said first source region lying wholly within the third region and spaced from its lateral boundary and with the side of the source contiguous with the channel region being located within the peripheral portion of the third region of laterally decreasing impurity concentration which thereby becomes located in the channel region, said channel region thereby having adjacent the source a one type forming impurity concentration that is larger than that in the substrate portion underlying the third region and that decreases in the direction from source to drain, ohmic contacts to the source, drain, and gate, and an ohmic connection to the third region.

8. An insulated gate field effect transistor comprising a monocrystalline semiconductor body having a first portion on one type conductivity having a surface, second and third spaced regions of the body and of the opposite type conductivity constituting source and drain regions, respectively, and defining therebetween a channel region in the first portion, a fourth surface zone of the said one type conductivity in the first body portion, said fourth zone containing active impurities forming said one type conductivity distributed in a concentration which decreases from the surface into the body portion bulk and which also decreases in a peripheral portion, a dielectric layer on the surface and over the channel region, a conductive layer on the dielectric layer and overlying the channel region and constituting a gate electrode, said second source region lying wholly within the fourth zone and spaced from its outer boundary and with the side of the source contiguous with the channel region being located within the peripheral portion of the fourth zone of decreasing impurity concentration which thereby becomes located in the channel region, said channel region thereby having adjacent the source a one type forming impurity concentration that is larger than that in the body portion underlying the fourth zone and that decreases in the direction from source to drain, and ohmic connections to the source, drain, and gate.

9. A transistor as set forth in claim 8 wherein an ohmic connection is made to a surface portion of the fourth zone available at said surface.

* * * * *